(12) United States Patent
Dausmann et al.

(10) Patent No.: US 8,059,320 B2
(45) Date of Patent: Nov. 15, 2011

(54) METHOD FOR PRODUCTION OF DOCUMENTS WITH A HOLOGRAM AND A DOCUMENT WITH A HOLOGRAM

(75) Inventors: Günther Dausmann, Grasbrunn (DE); Irina Menz, Grasbrunn (DE)

(73) Assignee: Hologram Industries Research GmbH (DE)

( * ) Notice: Subject to any disclaimer, the term of this patent is extended or adjusted under 35 U.S.C. 154(b) by 412 days.

(21) Appl. No.: 12/300,915

(22) PCT Filed: May 16, 2007

(86) PCT No.: PCT/DE2007/000890
§ 371 (c)(1),
(2), (4) Date: Nov. 14, 2008

(87) PCT Pub. No.: WO2007/131496
PCT Pub. Date: Nov. 22, 2007

(65) Prior Publication Data
US 2009/0262407 A1    Oct. 22, 2009

(30) Foreign Application Priority Data
May 16, 2006   (DE) .................. 10 2006 023 159

(51) Int. Cl.
*G03H 1/00* (2006.01)
*B42D 15/00* (2006.01)

(52) U.S. Cl. ............................................. 359/2; 283/86

(58) Field of Classification Search ......... 359/2; 283/86
See application file for complete search history.

(56) References Cited

U.S. PATENT DOCUMENTS

| 5,415,950 A | 5/1995 | King et al. |
|---|---|---|
| 5,856,048 A | 1/1999 | Tahara et al. |
| 2002/0018430 A1* | 2/2002 | Heckenkamp et al. .. 369/109.01 |
| 2003/0230816 A1 | 12/2003 | Kappe et al. |
| 2007/0297211 A1 | 12/2007 | Ehreke et al. |

FOREIGN PATENT DOCUMENTS

| EP | 0324482 | 7/1989 |
|---|---|---|
| EP | 0828203 | 3/1998 |
| EP | 0896260 | 2/1999 |
| WO | 9513568 | 5/1995 |
| WO | 2004005038 | 1/2004 |

* cited by examiner

*Primary Examiner* — Alessandro Amari
(74) *Attorney, Agent, or Firm* — The Webb Law Firm

(57) ABSTRACT

In a method for production of documents with a hologram and a document with a hologram, wherein, in a first step, a hologram is exposed in a photographic film and, in a second step, the photographic film is applied to a document support, the individualisation of the holograms first occurs during the gluing or after the gluing to the printed personal document or to the protective film provided for the surface protection of the document. It is thus possible to produce in a secure and economical fashion documents with individual holographic information of greater visibility and with further novel security features.

11 Claims, 2 Drawing Sheets

METHOD FOR PRODUCTION OF DOCUMENTS WITH A HOLOGRAM AND A DOCUMENT WITH A HOLOGRAM

BACKGROUND OF THE INVENTION

1. Field of the Invention

The invention relates to a method for documents with a hologram and to a document with a hologram, which in particular can be used or is suitable for the large-scale production of valuable and security documents, i.e. of identity cards, travel passes and security passes, with person-dependent, individual, diffractive optical security elements, such as for example holographic portrait photographs.

2. Description of Related Art

It is known that organic swelling agents, such as for example solvents, which are brought into contact with volume holograms can increase diffraction efficiency and influence chromaticity. The diffusion of organic molecules into the volume hologram causes a swelling and thus a change in the spacing of the holographic grating planes, resulting, in particular for reflection volume holograms, in an intensification of colour (U.S. Pat. No. 5,415,950). Nevertheless, it is not possible to swell using solvents only partial portions of the hologram that represent new visible holographic information. This requires swelling agents, the diffusion properties of which can be locally varied in a targeted manner. Monomer-containing, light-curable layers meet this requirement (EP 0828203 A2, WO 95/13568).

The dry film colour tuning method by means of a colour tuning film known from DE 689 05 610 T2, WO 95/13568 is also based on this property. In this method, the colour tuning film, consisting of a monomer-containing layer with a support film, is laminated onto a photopolymer hologram, tempered and withdrawn again from the photopolymer film. As a result of the tempering process, monomer migrates into the photopolymer and causes, in this case by swelling, a colour shift over the entire area. Partial exposure can also be carried out through a mask, with subsequent tempering and the colour tuning film being withdrawn again. The partially exposed regions in this case do not swell, as the monomers in the colour tuning film polymerise and can no longer diffuse. In this way, it is possible subsequently to introduce individual information into the photopolymer. Nevertheless, it is not known to generate individual personal data, such as for example a passport photo, by means of the colour tuning method. A drawback of this is, in addition to the necessary long tempering time of 30 minutes, which the relatively stationary monomers of the dry colour tuning film require to diffuse into the hologram, the additional material costs, in conjunction with large amounts of waste which accumulate and the additional lamination and delamination process. That is to say, owing to the excessively low bond strength, the colour tuning film cannot remain on the surface of the hologram to protect the surface of the document and must therefore be delaminated again.

For the large-scale production of documents, it is known first to produce an individual volume hologram comprising, in addition to the individual data, also standard information which was copied from a hologram master, and afterwards to attach this hologram to an associated document. In this case, the volume hologram can be generated by individual laser exposure of each individual security element in a photographic material. This can take place for example using a method, such as is known from EP 0896260 A2, with which diffractive, volume holographic, individual security features are produced on a large scale by individual laser exposure of each individual security element in the photographic material which is then later applied to the document associated therewith. The correct allocation of the individualised hologram to the corresponding personal document therefore requires costly material logistics with costly data collation. A further drawback is that two different lasers have to be used to copy standard data using one laser and to expose the individualised data using the second laser.

SUMMARY OF THE INVENTION

The invention is therefore based on the object of disclosing an economical method for the large-scale production of documents with a hologram and a document with a hologram of the above-mentioned type, providing individualised holograms with novel, visually checkable authenticity features having higher falsification protection for documents and valuable papers and a high level of security of the individual diffractive security feature with improved visibility.

Accordingly, the individualisation of the holograms occurs during or after the gluing to a document support, for example a printed personal document, or the surface protective film necessary for the document surface protection. It is thus possible to produce on a large scale diffractive optical security elements having a constantly changing information content, without the production method being complicated by the control complexity of allocating the hologram and a document support or the requirement of reintroducing, in the event of errors, the document supports and/or holograms into the method. The method according to the invention allows simpler data collation and materials and method steps can be spared compared to the prior art. Furthermore, the security costs are reduced during storage or transportation of the holographic photographic film, if the application to the document is to take place only at a later point in time or at a different location, as the photographic film does not yet contain any security-relevant personal data.

For this purpose, use is advantageously made of a light-curable, preferably monomer-containing swelling agent which can partially diffuse into the holographic photographic film by means of mask exposure and be cured with light. The photographic film used can be a photopolymer, including, for example silver halide/gelatin-based, volume holographic recording films.

In particular, it is advantageous if the materials which are to be used for the document application anyway, such as light-curable adhesive und/or surface protective lacquer, are used to generate the individual holographic information using their colour shift properties. The material and process step costs are in this case minimal, complex laser individualisation is not necessary and individual information, such as for example the passport photo, can be obtained in high quality and with colour gradings.

Furthermore, in an advantageous manner, it is possible to generate, during the gluing to the document, individual holographic data and, for example during the application of surface protective lacquer to the applied hologram, further additional information which differ in terms of chromaticity, thus leading to a further increase in the security level of the holographic features.

Advantageously, the holographic standard elements are copied from the master using laser light in the blue wavelength range. The more short-wave the laser wavelength is during the exposure of the hologram, the more densely packed, as is known, are the Bragg grating planes in the reflection volume hologram and accordingly more possibilities are obtained for targeted gradings of the colour shift to longer wavelengths as a result of chemically caused "swelling" or an increase in the spacing of the grating planes.

The laser exposure of the holograms in the first step is also simplified. That is to say, all that must now be carried out is the copying of the standard hologram data and no longer any laser individualisation which can lead to errors. In addition, it is possible to attain multicoloured individual hologram information, although exposure is carried out using only one laser wavelength.

Furthermore, the method according to the invention produces possibilities for novel detectable holographic security features.

If the swelling agent is not immediately cured with light over the entire area, but rather in the first place partially exposed through an information-containing greyscale mask, for example through an LCD with a computer-generated greyscale mask, then the swelling agent layer causes, owing to its different degree of curing corresponding to the grey mask regions, a differentiated diffusion and locally different increase in the size of the grating plane spacing. As a result, the colour shift also occurs individually and in a different manner for each image point and allows as a result a purposefully adapted colour representation of the greyscale information. The image of the grey value information is converted into a colour shift image. The further diffusion of any remaining swelling agent can be stopped after an action time by a concluding exposure until complete curing. It is thus possible to generate a multicoloured hologram using only one laser. In this case, the infiltration depth of the adhesive, i.e. the number of swollen and unaltered grating planes, must be taken into account for an image tuned with authentic colours. The greyscale mask must be computed in such a way that specific greyscales produce the respectively desired colour shifts; this can be achieved for a selected swelling medium in view of the mask exposure time.

If the greyscale mask is computed as a function of a specific exposed starting colour of the hologram, which is advantageously in the blue wavelength range, of the selected swelling agent, the selected mask exposure time and the light intensity, then it is possible to attain a desired colour shift in the different grey regions that produces an authentic colour image, as all wavelengths of visible light are attainable.

Advantageously, the volume hologram can be exposed, by laser copying from a master hologram containing, in addition to the hologram surface provided for the subsequent individualisation, still further holographic standard elements, in such a way that the Bragg planes are arranged at an angle, differing from 90° and 180°, preferably at a flat angle, i.e. not parallel, to the plane of the photographic film.

As a result of the swelling of the photographic layer, the thickness thereof increases and the angle of the Bragg planes becomes steeper. This produces regions in which the hologram reconstructs at different angles and, in the event of tilting, displays a more clearly visible colour change, if the original Bragg grating planes lie at a flat angle to the photographic film. This tilting effect can be used as a security feature to determine authenticity.

In an advantageous embodiment, the swelling agent layer is at the same time the adhesive layer for adhering the photographic film to the document or the protective film to be used for long-term surface protection of the document. The swelling agent can however also be the protective lacquer used to seal the surface of the hologram applied to the surface of the document.

This makes the production method simpler and more economical, as the adhesive layer or protective lacquer, which is required in any case, can at the same time perform this function of the swelling agent layer. For this purpose, use can be made of a monomer-containing adhesive or lacquer which can be cured with light and has a great adhesive force between the photopolymer and a document support surface or relative to the photopolymer. Preferably, the adhesive is urethane acrylate-based.

In this case, after a first swelling by way of the adhesive layer, as the swelling agent, and the curing thereof, a second swelling agent layer can be applied to the other side of the photographic film and subsequently the swelling agent of the second swelling agent layer can diffuse into the photographic film for a defined period of time, so that the photographic film swells again and the grating plane spacing of the Bragg grating planes increases in size. Finally, the further diffusion of the swelling agent of the second swelling agent layer is completed by complete exposure.

For example, it is possible during the bonding of a photopolymer hologram to the document for an individual item of information to be generated by means of mask exposure and, after complete adhesive curing, for the hologram support film, for example a PET film, to be withdrawn and the now exposed other hologram layer side to be sealed with a UV lacquer and thus protected from damage. The UV lacquer sealing allows a further image-by-image exposure with subsequent complete exposure, as a result of which further individualised information or a further change in colour of the individual information already provided and of the standard elements copied from the master is attained.

As a result of the dual individualising, once during the bonding and finally during the sealing, a further multiplicity of variations can be attained with regard to the authentic chromaticity of the individual data. This allows, as swelling is carried out using two different swelling agents of differing size and diffusion speed, supplementary colour shifts to be attained. In this case, all methods which are applied in the first swelling can also be used in the second swelling.

It is advantageous if the swelling agent layer contains a quick-diffusing swelling agent. As the diffusion of the swelling agent occurs from the outside onto the photographic film, in the first place only the region of the outer Bragg grating planes of the hologram is swollen. The spacings of the deeper grating planes remain unaffected. In a quick-diffusing swelling agent, this produces a clear division between the swollen and non-swollen region. This causes the Bragg grating planes to have two angles with a sharp kink as the transition. Changing the viewing angle reveals a pronounced colour tilting effect which can be used as a visually checkable security feature, which is difficult for counterfeiters to imitate, to determine authenticity. In this case, the infiltration depth can again be controlled by way of the duration of the exposure, or the period of time during which diffusion is facilitated.

Furthermore, the method according to the invention can be used to generate further patterns or data in the non-visible spectral range. For example, specific hologram regions can be altered by dual swelling so as to provide a reconstruction in the infrared range, which can be machine-detected as concealed security features.

A document according to the invention provides a document which can be produced economically on a large scale with a hologram as a security element.

BRIEF DESCRIPTION OF THE DRAWINGS

The invention will be described hereinafter in greater detail based on a plurality of exemplary embodiments and with reference to the drawings, in which.

DETAILED DESCRIPTION OF THE INVENTION

In the method according to the invention, firstly (not shown) a photopolymer film, which is wound onto a roll and consists of a photosensitive layer and a film support, is laminated onto a master drum; laser light is used to copy the master holograms which have, in addition to the holographic standard elements, at least one holographic grid with Bragg grating planes which are arranged so as not to be parallel to the master surface. UV light is then used for fixing and if appropriate tempering. This holographic photographic film can again be wound up and stored until it is applied to the document.

Figure 1:
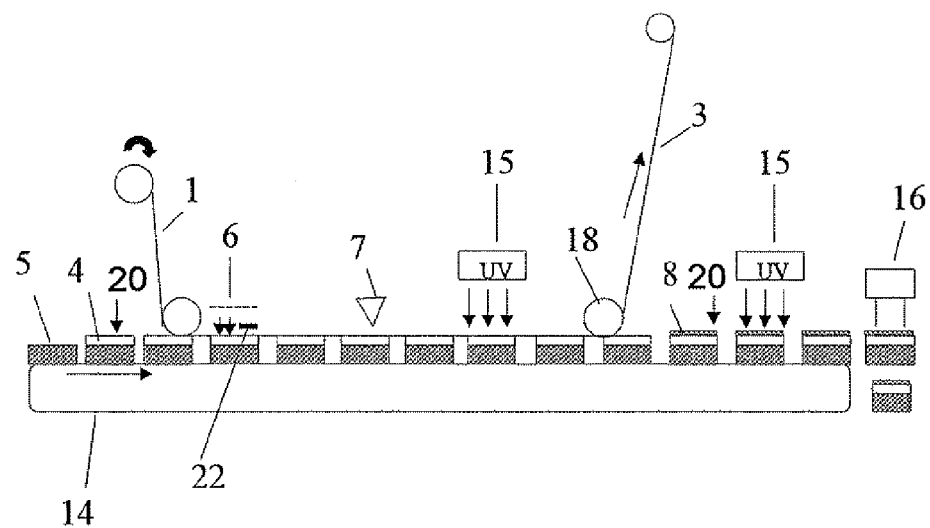
FIG. 1 shows schematically a first embodiment of a sequence of a method according to the invention.

As shown in FIG. 1, the application and individualisation of the photographic film 1 using the method according to the invention commences with the application of the light-curable, for example urethane acrylate-containing, adhesive 4, preferably by screen printing 20, to the personalised document 5. Then, the holographic layer side 2 of the photographic film 1 is laminated onto the document 5 with the aid of a laminating roller 17, the personal data are read and the LCD greyscale mask 6 is produced in accordance with the read personal data. This is followed by the first exposure of the surface of the document, preferably for exposure times of 1-5 sec, by the LCD greyscale mask 6; the document is conveyed onward with the aid of a conveyor belt 14 and in the meantime the incipient colour shift is measured using a colour detector 7. After attaining the desired colour shift, the adhesive composite is cured, preferably after 30 sec to 2 min, over the entire area with UV light in a light-curing station 15. Afterwards, the film support 3 is withdrawn via a withdrawal roll 18 and the hologram surface of the document is sealed with a light-curable lacquer 8 after the application thereof by a screen printing means 20 for long-term surface protection. Afterwards, the document is punched into the end format via a punch 16. This provides a document with a surface-protected, individualised volume hologram overlay, in which the individual holographic information 12, in particular the passport photo, is visible in a plurality of colours and with high contrast.

Figure 2:
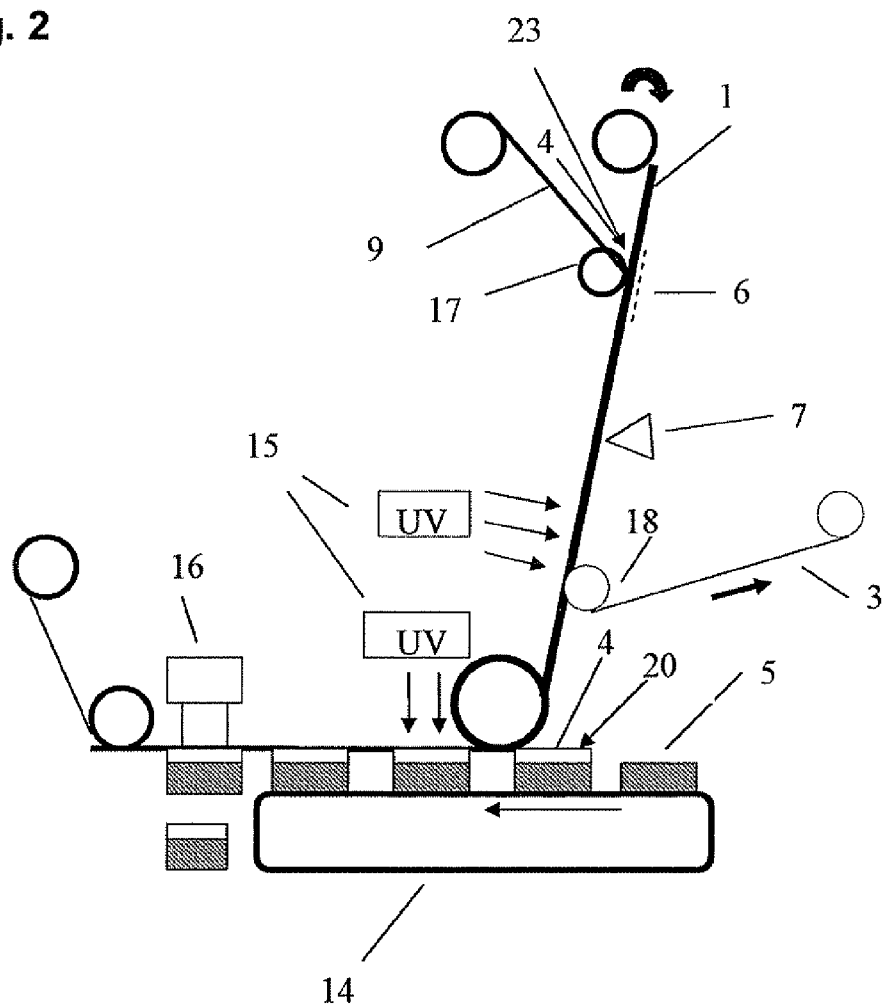
FIG. 2 shows schematically a second embodiment of a sequence of a method according to the invention.

In the exemplary embodiment according to FIG. 2, the holographic photographic film 1 the exposure of which has already been described in the first exemplary embodiment, is coated with a light-curable, urethane acrylate-containing adhesive 4, for example using doctor blade technology 23; a scratchproof transparent protective film 9, which serves ultimately to protect the surface of the document 5, is then laminated on. The personal data of the supplied document are read, the LCD mask (6) is produced, and exposure carried out therethrough. After attaining the desired colour shift, light-curing is carried out other the entire area in the light-curing station 15 and the polymer film support 3 is withdrawn with the aid of the withdrawal roll 18. The time for attaining the desired colour shift can be shortened with the assistance of heat to a few seconds. Afterwards, the individualised photographic film is adhered to the corresponding document using light-curable adhesive 4 and the document is punched out to the end format size with the aid of a punch 16 and the overhanging film remnants are wound up.

Figure 3:
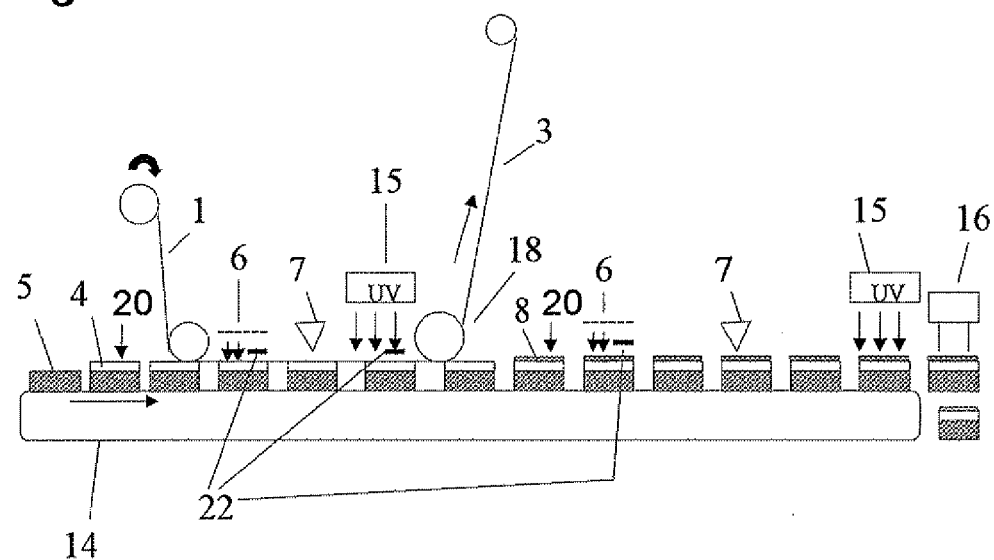
FIG. 3 shows schematically a third embodiment of a sequence of a method according to the invention.

FIG. 3 shows an exemplary embodiment in which holographic information is generated or altered from both sides of the photographic film during the application to the document.

Thus, the holographic photographic film 1 is first laminated onto the document 5 which is coated with adhesive 4, exposed through an LCD mask 6 which contains the individual data and also covers for example partial regions of the holographic standard elements. After attaining the desired colour shift, apart from a selected region which is covered by a screen 2, curing is carried out over the entire area in a light-curing station 15. After withdrawal of the support film 3, the light-curable UV lacquer 8 is applied to the hologram layer of the applied photographic film, for example by screen printing 20; additional information and/or additional colour changes are introduced into the photographic film through a further LCD mask exposure, before the UV lacquer is sealed by exposure over the entire area. Afterwards, the document is cut out into the end format using the punch 16.

A document is obtained with a holographic overlay, in which both the holographic standard elements and the introduced individual information can be detected with high lustre in colours which differ in a defined manner in a reconstruction angle range. The hologram region which is left uncovered by the screen 22 during the adhesive curing over the entire area is, as a result of the uninterrupted shift time up to the concluding surface protective lacquer light-curing, no longer visible, but can be detected using infrared light as a concealed security feature.

Figure 4:
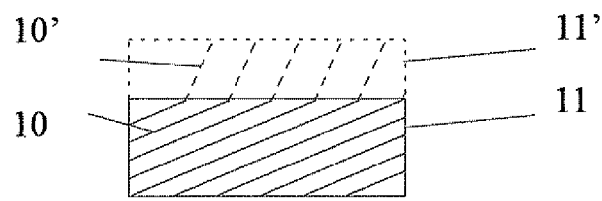
FIGS. 4 and 5 show schematically a fourth embodiment of a sequence of a method according to the invention.
Figure 5:
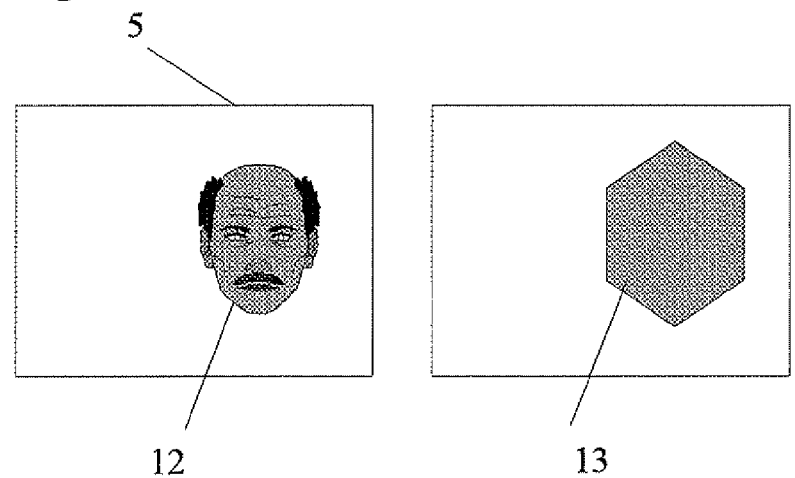

With regard to FIG. 4 and FIG. 5, which relate to a fourth exemplary embodiment, it should be noted that that firstly the master holograms are copied from the master, using laser light having a wavelength of 442 nm at an angle of 30°, into the photographic film, fixed, tempered and wound up. Then, the holographic photographic film 1 is, as described under FIG. 1, individualised during the adhering to the document 5, albeit with the difference that the shift time between mask exposure and light exposure over the entire area has been selected so as to be shorter by half. As a result, a pronounced tilting effect of the holographic individual information is attained, i.e. this information is visible only from one viewing angle. At a different angle, the non-swollen hologram becomes visible in the blue colour corresponding to the laser copying light wavelength. Two items of holographic information are therefore provided one above the other and visible in various colours.

FIG. 4 is a schematic cross section of a small region of a hologram according to the invention. In this case, the parallel solid hatching lines represent the Bragg grating planes 10 before the swelling in the hologram layer 11 and the broken hatching lines represent the Bragg planes 10' and the overall thickness 11' of the hologram after the swelling. The grating planes 10', which have changed owing to the swelling process, are at an increased distance from one another and the angle of the Bragg grating planes to the plane of the photographic film has become steeper. This explains the colour change effect, which can be seen on tilting of the hologram applied to the document, and the possibility of separately detecting various items of information. This can be used as a further security feature.

FIG. 5 shows an example of the separate visibility of the individual holographic information 12 in the form of a portrait and a 2D object 13 which was copied from the master 14 as a standard element.

Generally, the mask 6, which is used for individualising holograms, can also be generated by printing, if the document data are read out and said data are led to an inkjet printer which prints the data digitally as a mask onto the support film 3 or onto the film 7 to be adhered for document surface protection. Nevertheless, before the light-curing over the entire area, this mask has to be removed again.

The invention claimed is:

1. A method for production of documents with one or more holograms, comprising the steps of:
    exposing the each of the holograms in a photographic film;
    adhering via gluing the resultant holographic photographic film on one side thereof to a document carrier or to a transparent protective film provided for surface protection of a document; and
    allowing individualisation of the holograms to occur during the gluing or after the gluing, whereby the holographic photographic film is brought into contact with a first light-curable swelling agent during the adhering step, wherein the first swelling agent is subjected to a mask exposure, so that a differentiated swelling of the holographic photographic film occurs as a result of differentiated diffusing of the first swelling agent into the holographic photographic film, as a function of the differences in the amount of light caused by the mask, and after a defined period of time the swelling is stopped by a complete exposure of the first swelling agent.

2. The method of claim 1, wherein at least a partial region of the holographic photographic film is exposed to laser light in the blue wavelength range.

3. The method of claim 1, wherein at least a region of the mask has different light transmission regions in the form of individual data, wherein the individual data comprises personal data and a passport photo relating to the document carrier onto which the hologram is to be applied.

4. The method of claim 1, wherein the first swelling agent is a light-curable glue or a surface protective lacquer used for gluing the holographic photographic film to the document carrier, for gluing the holographic photographic film to the protective film, or for providing a surface-protective sealing to the document, and is applied for example by screen printing means or using doctor blade technology.

5. The method of claim 1, further comprising the step of applying a second swelling agent to another side of the holographic photographic film after the swelling of the first swelling agent occurs, wherein the second swelling agent is light-cured and to diffuse into the holographic photographic film in a differentiated manner, so that the holographic photographic film swells again and finally the further diffusion of the second swelling agent is stopped by complete exposure.

6. The method of claim 5, wherein the first and second swelling agents are quick-diffusing and contain monomers.

7. The method of claim 5, wherein the second swelling agent is a light-curing adhesive or a lacquer, and is applied for example by screen printing means or using doctor blade technology.

8. The method of claim 5, wherein the hologram comprises patterns or data in the non-visible spectral range.

9. The method of claim 5, wherein the hologram displays individual information in different colors and the holographic information is viewable from different viewing angles.

10. A document having at least one hologram, wherein the at least one hologram is produced by following the steps of:
    exposing a hologram in a photographic film;
    adhering via gluing the resultant holographic photographic film on one side thereof to a document or to a transparent protective film provided for surface protection of the document;
    allowing individualisation of the hologram to occur during the gluing or after the gluing, whereby;
    the holographic photographic film is brought into contact with a first light-curable swelling agent during the adhering step, wherein the first swelling agent is subjected to a mask exposure, so that a differentiated swelling of the holographic photographic film occurs as a result of differentiated diffusing of the first swelling agent into the holographic photographic film, as a function of the differences in the amount of light caused by the mask, and after a defined period of time the swelling is stopped by a complete exposure of the first swelling agent,
    wherein the first swelling agent is a light-curable glue or a surface protective lacquer, is quick-diffusing and contains monomers.

11. The document of claim 10, wherein a second swelling agent is applied to another side of the holographic photographic film after the swelling of the first swelling agent is stopped, wherein the second swelling agent is light-cured and diffused into the holographic photographic film in a differentiated manner, so that the holographic photographic film swells again, and finally, further diffusion of the second swelling agent is stopped by complete exposure, wherein the second swelling agent is a light-curing adhesive or a lacquer, and is quick-diffusing and contains monomers.

* * * * *